United States Patent
Horie et al.

(10) Patent No.: US 8,964,273 B2
(45) Date of Patent: Feb. 24, 2015

(54) OPTICAL REFLECTION ELEMENT

(75) Inventors: Toshiaki Horie, Osaka (JP); Shinsuke Nakazono, Osaka (JP); Soichiro Hiraoka, Hyogo (JP); Shigeo Furukawa, Osaka (JP); Kiyomi Furukawa, legal representative, Osaka (JP); Yuta Yamamoto, Osaka (JP); Kazuki Komaki, Osaka (JP); Masaki Tada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 312 days.

(21) Appl. No.: 13/698,327

(22) PCT Filed: Jun. 21, 2011

(86) PCT No.: PCT/JP2011/003519
§ 371 (c)(1),
(2), (4) Date: Nov. 16, 2012

(87) PCT Pub. No.: WO2011/161943
PCT Pub. Date: Dec. 29, 2011

(65) Prior Publication Data
US 2013/0107339 A1    May 2, 2013

(30) Foreign Application Priority Data
Jun. 24, 2010   (JP) .................................. 2010-143477

(51) Int. Cl.
*G02B 26/08* (2006.01)
*G02B 7/182* (2006.01)
*B81B 3/00* (2006.01)

(52) U.S. Cl.
CPC .......... *G02B 7/1821* (2013.01); *G02B 26/0833* (2013.01); *B81B 3/0045* (2013.01); *G02B 26/0858* (2013.01); *B81B 2203/0163* (2013.01); *B81B 2201/042* (2013.01)
USPC .................. 359/199.1; 359/213.1; 359/214.1; 359/224.1

(58) Field of Classification Search
CPC ............. G02B 26/0833; G02B 7/1821; B81B 2203/0163
USPC ...................... 359/198.1–199.4, 200.6–200.8, 359/213.1–215.1, 221.2, 224.1–226.2
See application file for complete search history.

(56) References Cited

U.S. PATENT DOCUMENTS

| 6,327,855 B1 | 12/2001 | Hill et al. |
| 2003/0057412 A1 | 3/2003 | Boutaghou et al. |

(Continued)

FOREIGN PATENT DOCUMENTS

| CN | 1319943 | 10/2001 |
| CN | 1511253 | 7/2004 |

(Continued)

OTHER PUBLICATIONS

International Search Report of PCT Application No. PCT/JP2011/003519 dated Jul. 19, 2011.

(Continued)

*Primary Examiner* — James Phan
(74) *Attorney, Agent, or Firm* — Panasonic Patent Center (57) ABSTRACT

An optical reflection element according to the present invention includes a fixed frame, a pair of first oscillation parts, a movable frame, a pair of second oscillation parts, and a mirror part. One-side ends of the first oscillation parts are connected to the inside of the fixed frame. The movable frame is connected to and held by the other-side ends of the pair of first oscillation parts to be pivotable. One-side ends of the pair of second oscillation parts are connected to the inside of the movable frame and the pair of second oscillation parts are disposed to be substantially perpendicular to the pair of first oscillation parts. The mirror part is connected to and held by the other-side ends of the pair of second oscillation parts to be pivotable. The second oscillation parts have a meandering shape in which a plurality of straight portions and a plurality of folded portions are formed, and a stepped structure portion is provided in part of the folded portion.

16 Claims, 9 Drawing Sheets

(56) References Cited

U.S. PATENT DOCUMENTS

2006/0018049 A1   1/2006   Mizuno
2011/0292479 A1*  12/2011  Hiraoka et al. ............ 359/199.1

FOREIGN PATENT DOCUMENTS

| | | |
|---|---|---|
| JP | 2000-356545 | 12/2000 |
| JP | 2001-001300 | 1/2001 |
| JP | 2005-128147 | 5/2005 |
| JP | 2005-518657 | 6/2005 |
| JP | 2006-039067 | 2/2006 |
| JP | 2008-040240 | 2/2008 |
| JP | 2010-002637 | 1/2010 |
| WO | 03/027643 | 4/2003 |
| WO | 2010/058565 | 5/2010 |

OTHER PUBLICATIONS

English Translation of Chinese Search Report issued on Jul. 1, 2014, for the related Chinese Patent Application No. 201180030671.7.

* cited by examiner

OPTICAL REFLECTION ELEMENT

This application is a U.S. national phase application of PCT international application PCT/JP2011/003519 filed on Jun. 21, 2011 which has a priority based on Japanese application JP2010-143477 filed on Jun. 24, 2010.

BACKGROUND

1. Technical Field

The present invention relates to an optical reflection element used for a display apparatus or the like.

2. Background Art

Figure 10:
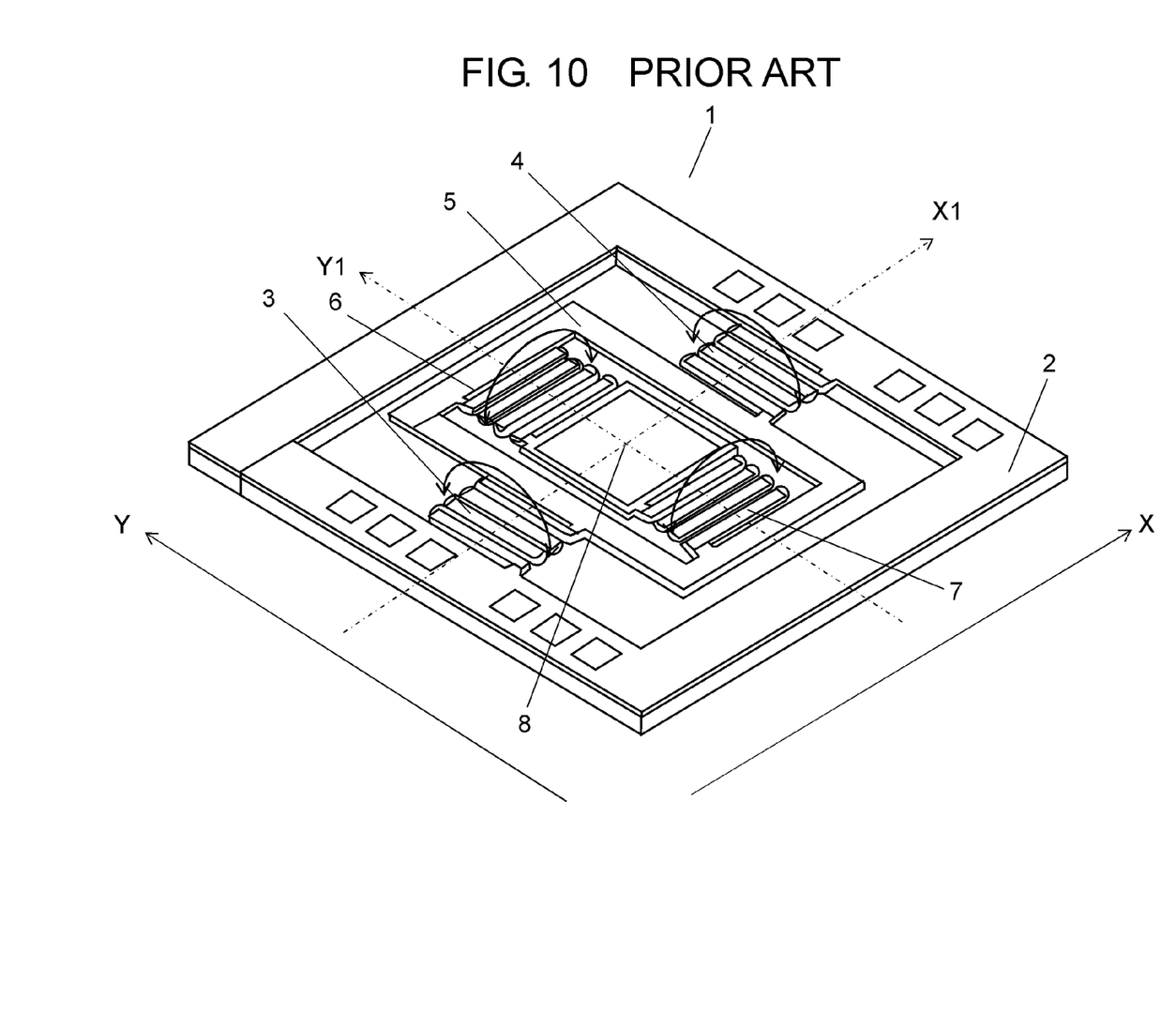
FIG. 10 is a perspective view illustrating a conventional optical reflection element.

Conventional optical reflection element 1 is shown in FIG. 10. As shown in FIG. 10, conventional optical reflection element 1 includes fixed frame 2, one pair of first oscillation parts 3 and 4, movable frame 5, one pair of second oscillation parts 6 and 7, and mirror part 8. One-side ends of one pair of first oscillation parts 3 and 4 are connected to the inside of fixed frame 2. Movable frame 5 is connected to and held by the other-side ends of one pair of first oscillation parts 3 and 4. One-side ends of one pair of second oscillation parts 6 and 7 are connected to the inside of movable frame 5 and are disposed to be substantially perpendicular to one pair of first oscillation parts 3 and 4. Mirror part 8 is connected to and held by the other-side ends of one pair of second oscillation parts 6 and 7 to be pivotable. Movable frame 5 is pivoted around the X axis (X1 axis) which is passing through the substantial center of mirror part 8 and along one pair of first oscillation parts 3 and 4. Mirror part 8 is pivoted around the Y axis (Y1 axis) which is passing through its center and along one pair of second oscillation parts 6 and 7. Thus, optical reflection element 1 scans a light flux (light spot) radiated and reflected from mirror part 8 in the X and Y axis directions and projects an image onto a screen.

Figure 11:
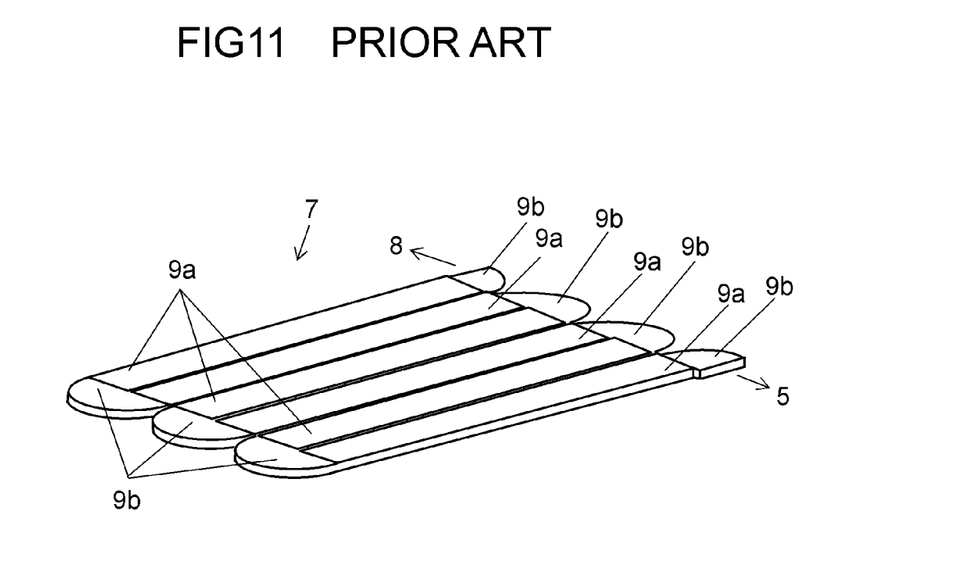
FIG. 11 is an enlarged perspective view illustrating second oscillation parts of the conventional optical reflection element.

FIG. 11 is an enlarged perspective view illustrating second oscillation part 7. As shown in FIG. 11, second oscillation part 7 has a so-called meandering shape in which a beam is folded a plurality of times. Second oscillation part 7 includes a plurality of straight portions 9a and a plurality of folded portions 9b formed by folding the plurality of straight portions 9a.

Figure 12:
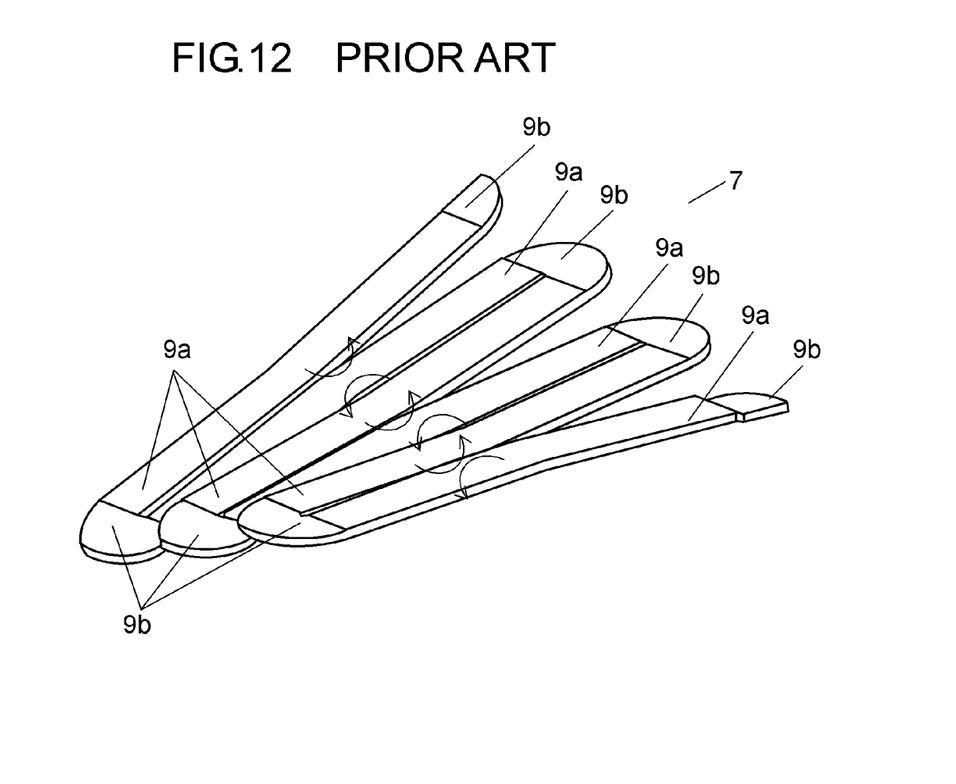
FIG. 12 is an enlarged perspective view for an operation of the second oscillation part of the conventional optical reflection element.

A driving element such as a piezoelectric body is formed in each of the plurality of straight portions 9a. In second oscillation part 7, large displacement of mirror part 8 is realized by driving the driving elements so that the phases of the driving elements are opposite to each other and by displacing and bending straight portions 9a in arrow directions so that the amount of displacement accumulates according to the number of straight portions 9a, as shown in FIG. 12.

For example, the optical reflection element of the application is disclosed in, for example, PLT 1.

To improve the resolution of a projected image, the scanning speed of a light flux (light spot) needs to be increased by increasing a driving frequency while maintaining the amount of displacement of each oscillation part. In this case, however, there is a problem that stress is focused on the folded portions of each oscillation part and thus crack or the like easily occurs.

CITATION LIST

Patent Literature

PLT 1 Unexamined Japanese Patent Publication No. 2008-040240

SUMMARY

An optical reflection element according to the present invention includes a fixed frame, a pair of first oscillation parts, a movable frame, a pair of second oscillation parts, and a mirror part. One-side ends of the first oscillation parts are connected to the inside of the fixed frame. The movable frame is connected to and held by the other-side ends of the pair of first oscillation parts to be pivotable. One-side ends of the pair of second oscillation parts are connected to the inside of the movable frame and the pair of second oscillation parts are disposed to be substantially perpendicular to the pair of first oscillation parts. The mirror part is connected to and held by the other-side ends of the pair of second oscillation parts to be pivotable. The second oscillation parts have a meandering shape in which a plurality of straight portions and a plurality of folded portions are formed, and a stepped structure portion is provided in part of the folded portion.

In the optical reflection element according to the present invention, since a mechanical strength of the folded portions of each oscillation part can be improved, the mirror part can be driven at a large pivotal angle (amount of displacement) and at a high frequency.

DESCRIPTION OF EMBODIMENTS

First Exemplary Embodiment

Hereinafter, an optical reflection element according to a first embodiment of the present invention will be described with reference to the drawings.

Figure 1:
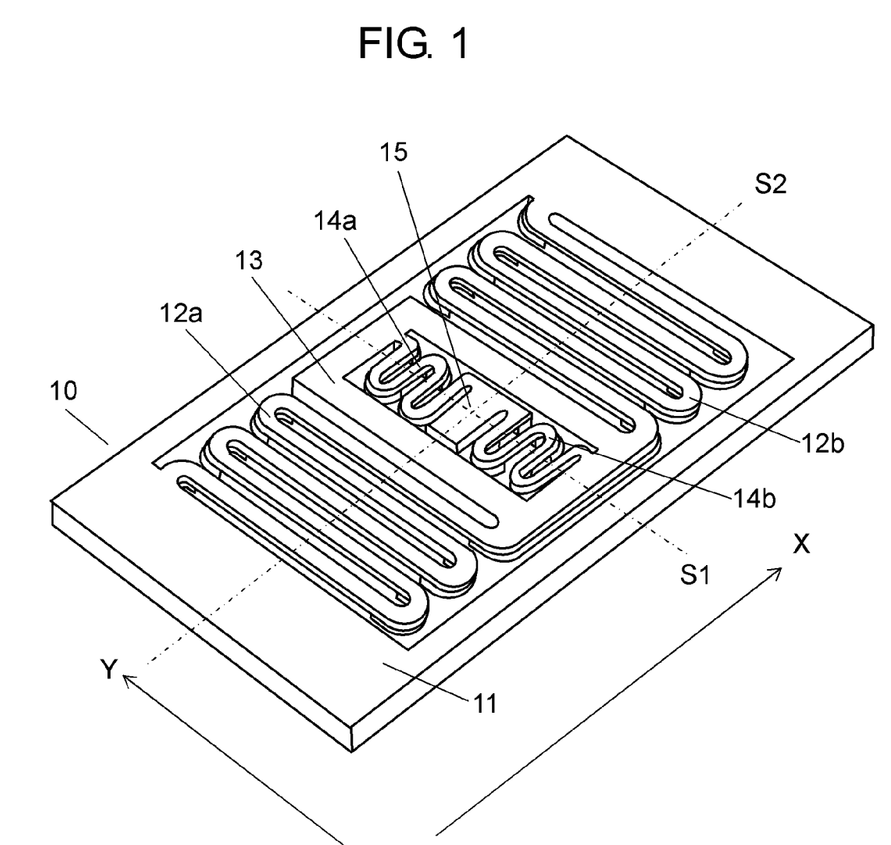
FIG. 1 is a perspective view illustrating an optical reflection element according to a first embodiment of the present invention.

FIG. 1 is a perspective view illustrating the optical reflection element according to the first embodiment of the present invention. As shown in FIG. 1, optical reflection element 10 according to this embodiment includes fixed frame 11, one pair of first oscillation parts 12a and 12b, movable frame 13, one pair of second oscillation parts 14a and 14b, and mirror part 15. One-side ends of one pair of first oscillation parts 12a and 12b are connected to and held by the inside of fixed frame 11. Movable frame 13 is connected to and held by the other-side ends of one pair of first oscillation parts 12a and 12b to be pivotable around an S2 axis. One-side ends of one pair of second oscillation parts 14a and 14b are connected to and held by the inside of movable frame 13. Second oscillation parts 14a and 14b are disposed to be substantially perpendicular to first oscillation parts 12a and 12b. Mirror part 15 is connected to and held by the other-side ends of one pair of second oscillation parts 14a and 14b to be pivotable around an S1 axis.

Fixed frame 11 according to this embodiment has a rectangular shape and a uniformly continuous shape surrounding the four sides of mirror part 15 and movable frame 13. However, movable frame 11 may have a circular or triangular shape or have a shape with one side open, as necessary. The same applies to movable frame 13.

One pair of first oscillation parts 12a and 12b are symmetric with respect to the Y axis (S1 axis) passing through the center of mirror part 15. The connection positions at which first oscillation parts 12a and 12b are connected to movable frame 13 and the connection positions at which first oscillation parts 12a and 12b are connected to fixed frame 11 are diagonally opposite to each other. That is, the connection positions at which first oscillation parts 12a and 12b are connected to fixed frame 11 are diagonally opposite to the connection portions at which first oscillation parts 12a and 12b are connected to movable frame 13. In this configuration, the pivotal axis along which movable frame 13 is actually pivoted can match the S2 axis. As a result, the inertia moment can be minimized when movable frame 13 is driven, and thus a driving efficiency can be improved.

Likewise, one pair of second oscillation parts 14a and 14b are symmetric with respect to the X axis (S2 axis) passing through the center of mirror part 15. Therefore, the intersection point between the S1 axis and the S2 axis is preferably located at center of mirror part 15.

Figure 2:
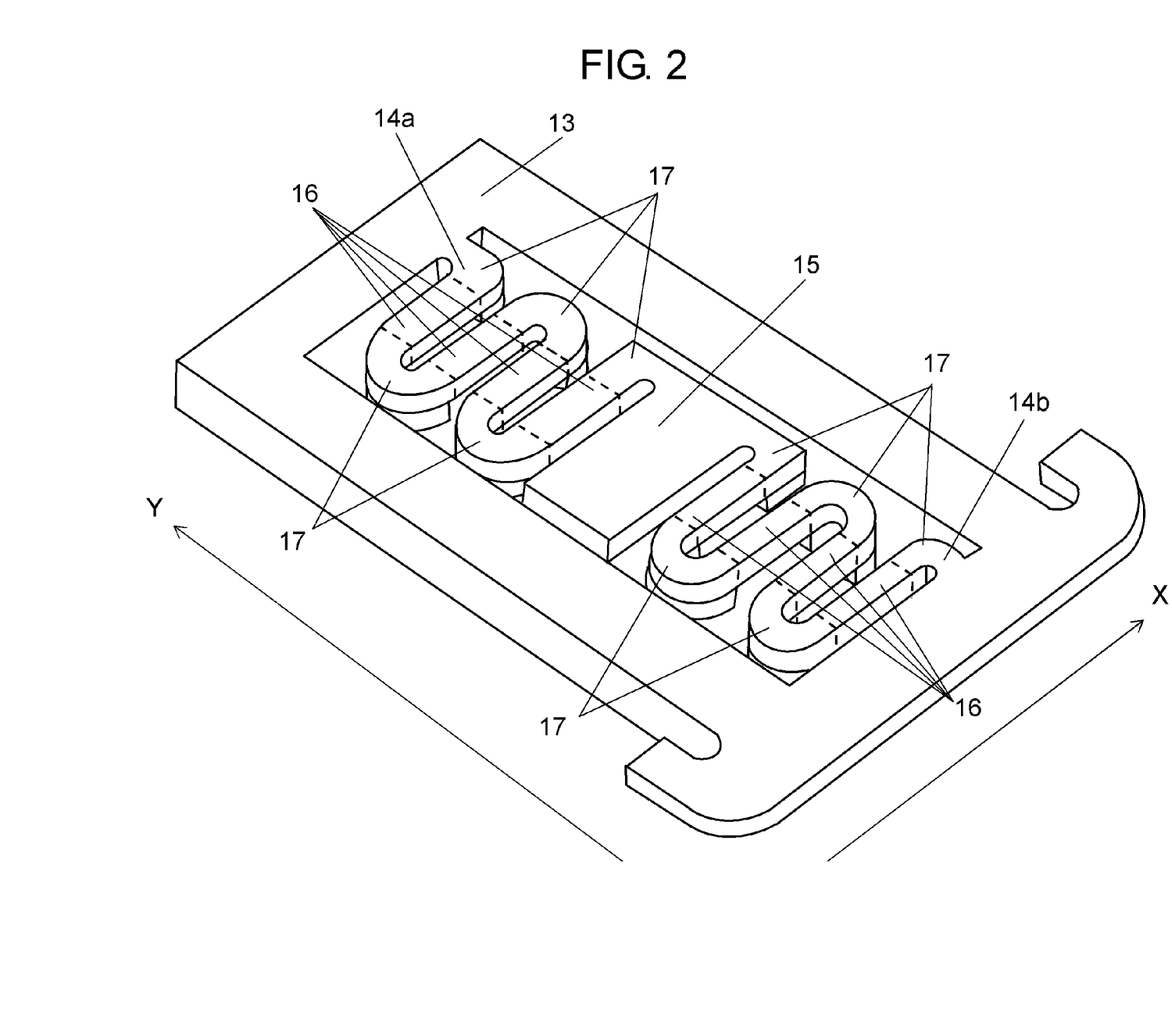
FIG. 2 is an enlarged perspective view illustrating the vicinity of a mirror part of the optical reflection element according to the first embodiment of the present invention.

FIG. 2 is an enlarged perspective view illustrating the vicinity of the mirror part of the optical reflection element according to the first embodiment of the present invention. FIG. 2 is the enlarged perspective view illustrating mirror part 15 in addition to movable frame 13. One pair of second oscillation parts 14a and 14b each have a meandering shape formed of a plurality of straight portions 16 (portions inside dotted lines in the drawing) and folded portions 17 having curvature and formed by folding ends of the plurality of straight portions 16. Thus, since second oscillation parts 14a and 14b have such a meandering shape, second oscillation parts 14a and 14b can be actually lengthened. Therefore, by combining the amounts of displacement of straight portions 16, the amount of rotation of mirror part 15 can be increased.

In this embodiment, folded portions 17 have curvature. However, for example, the ends of parallel straight portions 16 may be connected to each other as straight lines parallel to the Y axis. Here, second oscillation parts 14a and 14b driving mirror part 15 will be described in detail.

Figure 3:
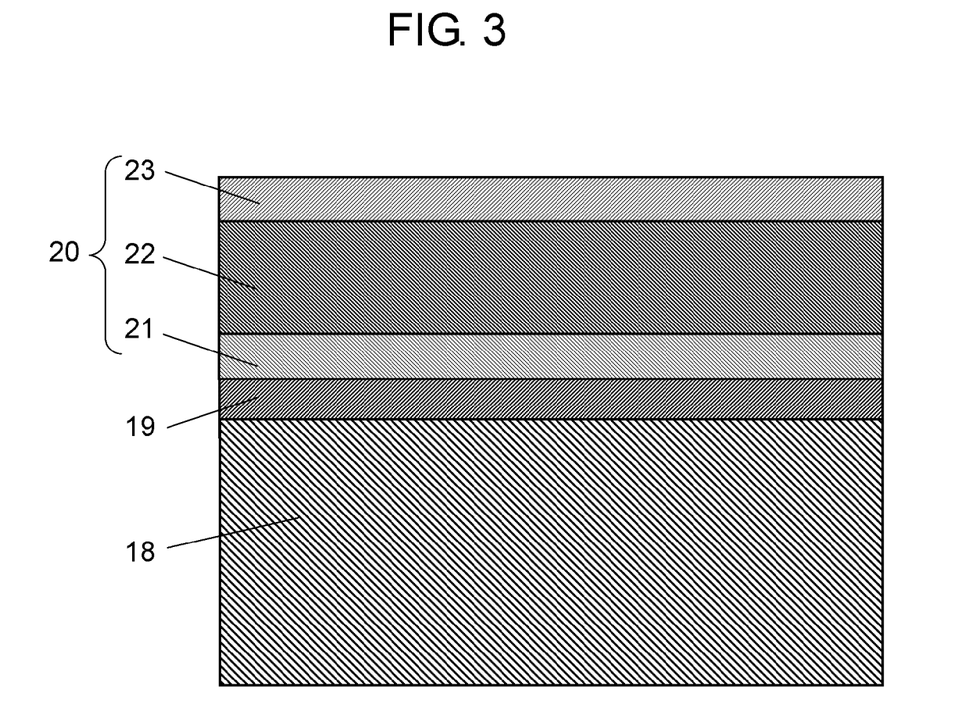
FIG. 3 is a sectional view illustrating a straight portion of a second oscillation part of the optical reflection element according to the first embodiment of the present invention.

FIG. 3 is a sectional view of one straight portion of the second oscillation part of the optical reflection element according to the first embodiment of the present invention. FIG. 3 is the sectional view illustrating second oscillation parts 14a and 14b (see FIG. 1).

Second oscillation parts 14a and 14b include common silicon substrate 18 formed as the lowermost layer, silicon oxide film 19 formed on silicon substrate 18, and piezoelectric actuator 20 formed on silicon oxide film 19.

Piezoelectric actuator 20 includes lower electrode layer 21, piezoelectric layer 22 laminated on lower electrode layer 21, and upper electrode layer 23 commonly laminated on piezoelectric layer 22.

Lower electrode layer 21 is made of platinum, upper electrode layer 23 is made of gold, and piezoelectric layer 22 is made of a piezoelectric material such as lead zirconium titanate $(Pb(Z_x,Ti_{1-x})O_3$, where $x=0.525)$. Such a piezoelectric material can be thinned by evaporation, a sol-gel method, CVD, sputtering, or the like.

By applying a predetermined voltage to lower electrode layer 21 and upper electrode layer 23, piezoelectric layer 22 can be bended, and thus second oscillation parts 14a and 14b are displaced. The amounts of displacement occurring in straight portions 16 adjacent to each other to be parallel with folded portions 17 interposed therebetween are combined, and consequently the amount of rotation of mirror part 15 can be enlarged.

When the amounts of displacement are combined, a voltage with the same phase may be applied to every other straight portion 16 adjacent to each other to be parallel with folded portion 17 interposed therebetween. Further, when there is room for the width of straight portion 16, upper electrode layer 23, which alternately applies voltages with positive and negative phases to adjacent straight portions 16, may be provided. Further, when straight portions 16 are narrow, common upper electrode layer 23 of straight portions 16 can be displaced in the same direction by alternately reversing the polarization direction of piezoelectric layer 22 with respect to adjacent straight portions 16. Thus, the displacement can be further combined by alternately applying the voltages with reverse phases to adjacent straight portions 16 or alternately reversing the polarization direction of piezoelectric layer 22 with respect to adjacent straight portions 16, compared to a case in which every other straight portion is displaced.

Next, folded portions 17, which are the main feature of the present invention, will be described in detail below.

Figure 4:
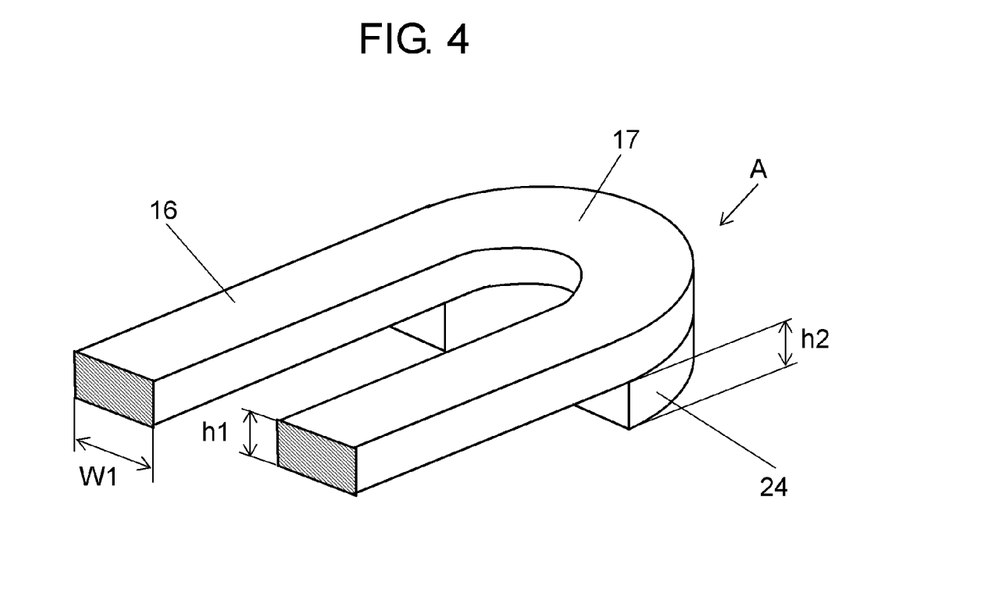
FIG. 4 is a partial sectional perspective view illustrating the second oscillation part of the optical reflection element according to the first embodiment of the present invention.

FIG. 4 is a partial sectional perspective view illustrating the second oscillation part of the optical reflection element according to the first embodiment of the present invention. FIG. 4 shows the configuration of folded portion 17 and straight portions 16 connected to folded portion 17. As shown in FIG. 4, folded portion 17 is configured to be thicker than straight portions 16 by providing stepped structure portion 24 below folded portion 17. At this time, when thickness h1 of straight portions 16 is less than width W1 of straight portion 16, thickness h2 of stepped structure portion 24 preferably satisfies the following relation.

$$h1+h2<W1$$

This is because when the total thickness of folded portion 17 and stepped structure portion 24 is greater than width W1 of straight portion 16, a resonant frequency of second oscillation parts 14a and 14b may decrease, compared to a conventional configuration in which stepped structure portion 24 is not provided.

Stepped structure portion 24 is provided on the entire lower surface of folded portion 17 in this embodiment, but may be provided in part of the lower surface of folded portion 17. When stepped structure portion 24 is provided in part of the lower surface of folded portion 17, stepped structure 24 is configured to be symmetric with respect to the central line (bisector: B-BB) of folded portion 17, as in FIG. 5, which is a front view when viewed in an A direction of FIG. 4.

Figure 5:
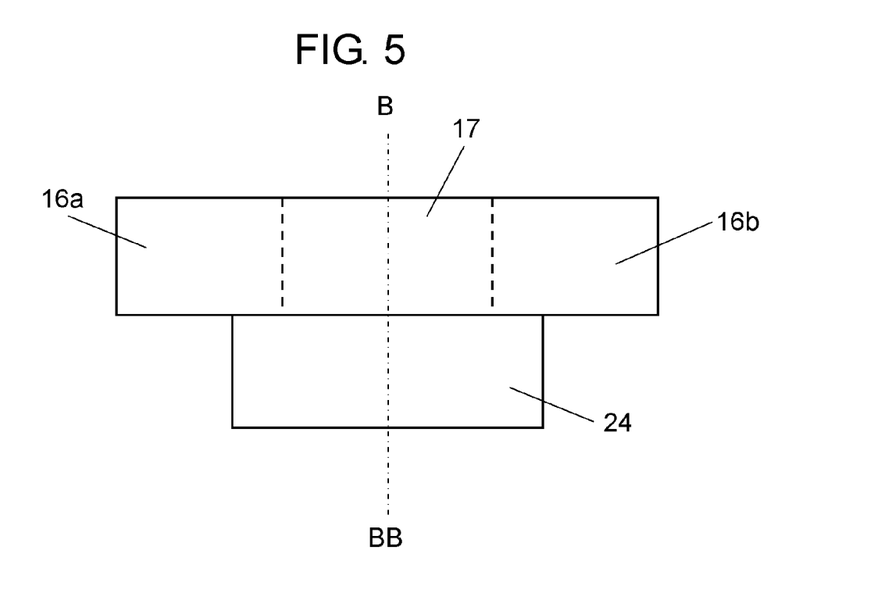
FIG. 5 is a front view when viewed from an A direction of FIG. 4.

Thus, a mechanical strength of folded portion 17 can be configured to be symmetric with respect to bisector B-BB, and folded portion 17 is not twisted due to the displacement of straight portions 16a and 16b. Consequently, a deviation in the pivotal axis of mirror part 15 can be reduced. Further, even when stress is focused on folded portions 17 of second oscillation parts 14a and 14b, second oscillation parts 14a and 14b can be prevented from being damaged.

In this embodiment, for example, stepped structure portion 24 is separately provided below folded portion 17, but may be integrated with folded portion 17. Further, stepped structure portion 24 may not be provided below folded portion 17, but may be provided above folded portion 17. When stepped structure portion 24 is provided above folded portion 17, stepped structure portion 24 can be easily provided after formation of optical reflection element 10. Therefore, productivity can be improved. When stepped structure portion 24 is formed above folded portion 17, stepped structure portion 24 may be formed of a metal material on only folded portion 17 by evaporation, sputtering, partial plating, or the like using a metal mask or the like or may be formed by applying a resin material by inkjet, dipping, or the like.

When stepped structure portion 24 is formed of a metal material, stepped structure portion 24 can be made of a metal material with a higher specific gravity than straight portion 16 by evaporation or sputtering. Therefore, stepped structure portion 24 can be thinned. Further, by selecting a material with an even higher specific gravity such as gold, platinum, tantalum, or tungsten, stepped structure portion 24 can be thinned. Therefore, the optical reflection element can be provided at a low cost.

Since stepped structure portion 24 is provided after the formation of optical reflection element 10, a driving frequency or a deflection angle can be adjusted within a given range. Therefore, a yield ratio can be improved, and thus productivity can be improved.

In this embodiment, for example, the outer circumferential surface of stepped structure portion 24 matches the outer circumferential surface of folded portion 17. However, the outer circumferential surface of stepped structure portion 24 may retreat inward from the outer circumferential surface of folded portion 17. Further, the outer circumferential surface of stepped structure portion 24 may protrude outward from the outer circumferential surface of folded portion 17.

Thus, stepped structure portion 24 according to the present invention contributes to improvement in the mechanical strength of folded portions 17 of second oscillation parts 14a and 14b. The same advantage can be obtained when the thickness of folded portion 17 is greater than the thickness of straight portion 16 or only folded portion 17 is made of another material with higher strength than straight portion 16.

Figure 6:
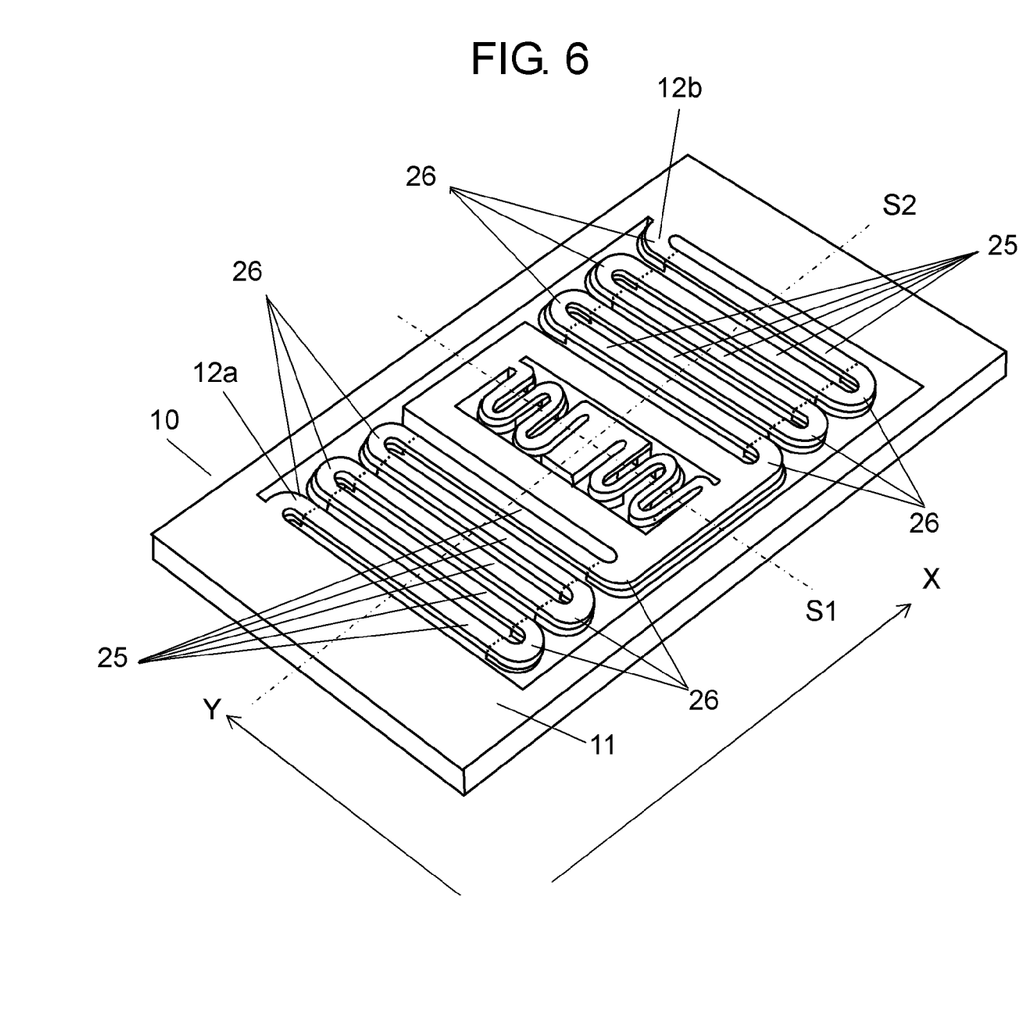
FIG. 6 is a perspective view illustrating the detailed configuration of a first oscillation part of the optical reflection element according to the first embodiment of the present invention.

Second oscillation parts 14a and 14b have been exemplified, but the same applies to first oscillation parts 12a and 12b. Hereinafter, first oscillation parts 12a and 12b will be described. FIG. 6 is a perspective view illustrating the detailed configuration of the first oscillation parts of the optical reflection element according to the first embodiment of the present invention. One pair of first oscillation parts 12a and 12b each have a meandering shape formed of a plurality of straight portions 25 (portions inside dotted lines in the drawing) and folded portions 26 having curvature and formed by folding the ends of the plurality of straight portions 25. Thus, since first oscillation parts 12a and 12b have such a meandering shape, first oscillation parts 12a and 12b can be actually lengthened. Therefore, by combining the amounts of displacement of straight portions 25, the amount of rotation of movable frame 13 can be increased. Since the configuration and the operation principle of one pair of first oscillation parts 12a and 12b are the same as those of second oscillation parts 14a and 14b, the detailed description thereof will not be repeated.

Figure 7:
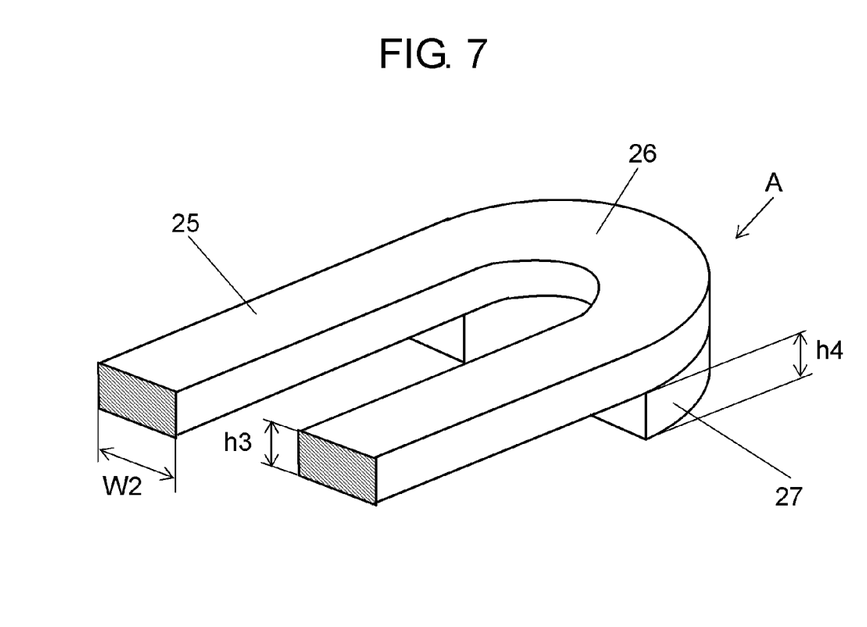
FIG. 7 is a partial sectional perspective view illustrating the first oscillation part of the optical reflection element according to the first embodiment of the present invention.

FIG. 7 is a partial sectional perspective view illustrating the first oscillation part of the optical reflection element according to the first embodiment of the present invention. FIG. 7 shows the configuration of folded portion 26 and straight portions 25 connected to folded portion 26. As shown in FIG. 7, folded portion 26 is configured to be thicker than straight portion 25 by providing stepped structure portion 27 below folded portion 26. At this time, a relation among thickness h3 of straight portion 25, width W2 of straight portion 25, and thickness h4 of stepped structure portion 27 preferably satisfies the following relation, as in second oscillation parts 14a and 14b.

$$h3+h4<W2$$

In this embodiment, stepped structure portion 27 is provided on the entire lower surface of folded portion 26, but may be provided in part of the lower surface of folded portion 26. When stepped structure portion 27 is provided in part of the lower surface of folded portion 26, stepped structure 27 is configured to be symmetric with respect to the central line (bisector: B-BB) of folded portion 26, as in FIG. 8 which is a front view when viewed in an A direction of FIG. 7.

Figure 8:
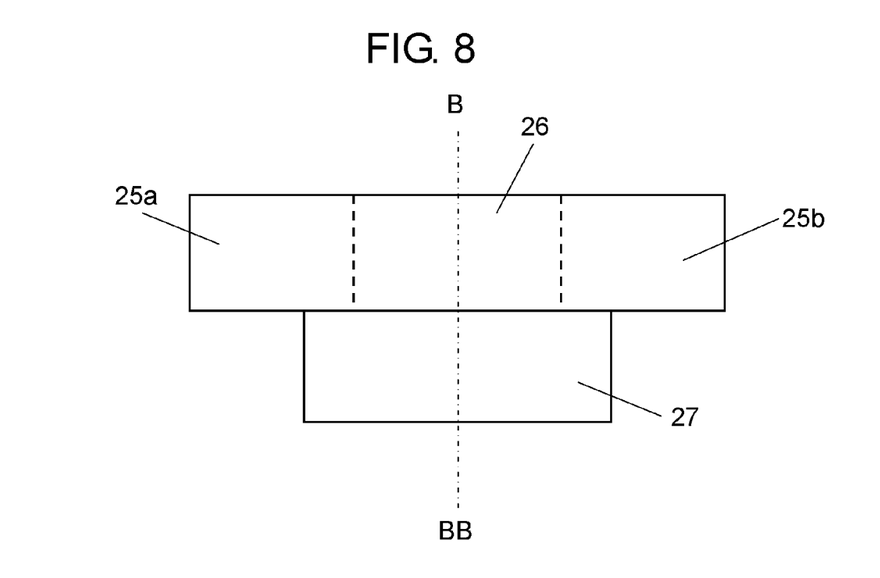
FIG. 8 is a front view when viewed from an A direction of FIG. 7.

Thus, since a mechanical strength of folded portion 26 can be configured to be symmetric with respect to bisector B-BB, folded portion 26 is not twisted due to the displacement of straight portions 25a and 25b. Since a deviation in the pivotal axis of movable frame 13 can be reduced, a deviation in the pivotal axis of mirror part 15 can be consequently reduced. Further, since the driving frequency is low in first oscillation parts 12a and 12b operating at a low speed, the displacement of first oscillation parts 12a and 12b is larger than that of second oscillation parts 14a and 14b operating at a high speed. Therefore, stress may be focused on folded portions 26, and thus the oscillation parts may be damaged in the worst case, as in second oscillation parts 14a and 14b. Accordingly, by providing stepped structure portion 27, the same advantage as that of second oscillation parts 14a and 14b can be obtained.

Finally, an operation of a display apparatus using optical reflection element 10 according to this embodiment will be described.

Figure 9:
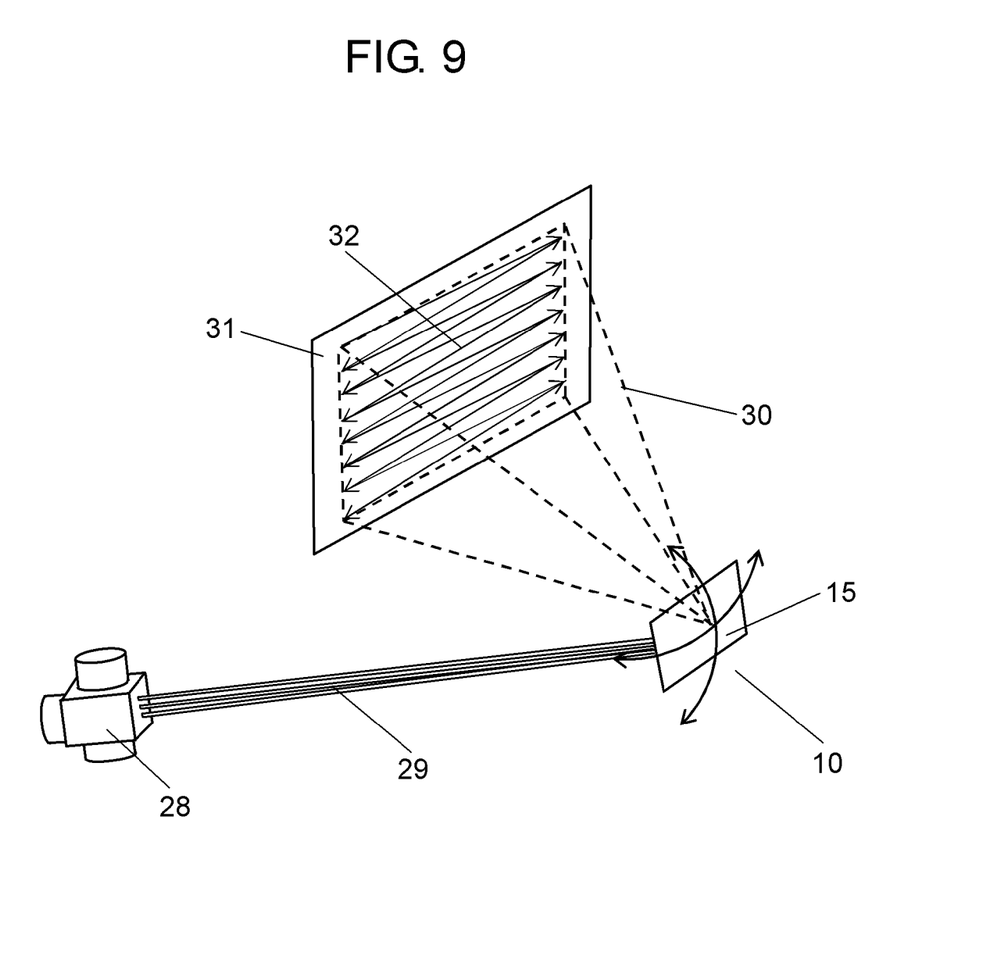
FIG. 9 is a diagram illustrating the configuration of an example of an image projecting apparatus using the optical reflection element according to the first embodiment of the present invention.

FIG. 9 is a diagram illustrating the configuration of an example of the display apparatus using optical reflection element 10 according to this embodiment.

As shown in FIG. 9, a light flux (incident light 29) is incident on mirror part 15 from light source 28 such as a laser light source, and reflected light 30 is scanned in the X and Y axis directions by oscillation of mirror part 15. Then, reflected light 30 is scanned simultaneously in two axis directions, and image 32 is projected onto screen 31 or a wall.

Thus, when optical reflection element 10 is operated, an alternating-current voltage of each resonant frequency is applied to each of upper electrodes 23 (see FIG. 3) of first oscillation parts 12a and 12b (see FIG. 1) and second oscillation parts 14a and 14b (see FIG. 1) to drive all of piezoelectric actuators 20 (see FIG. 3) of first oscillation parts 12a and 12b and second oscillation parts 14a and 14b. Here, when first oscillation parts 12a and 12b and second oscillation parts 14a and 14b are resonated, the amplitude thereof is increased. As a result, the pivotal angle about the X and Y axes of mirror part 15 (see FIG. 1) can be enlarged.

First oscillation parts 12a and 12b are bended alternatively and oscillated in direction of their thickness by the positive and negative phases of the alternating-current voltage (electrical signal) supplied from upper electrodes 23. This oscillation results in upper and lower (vertical) oscillation of movable frame 13 (see FIG. 1), thereby rotating mirror part 15 around the S2 axis using the center of mirror part 15 as a fixed point.

Second oscillation parts 14a and 14b are bended alternatively and oscillated in direction of their thickness by the positive and negative phases of the alternating-current voltage supplied from upper electrodes 23. This oscillation results in the upper and lower oscillation of the right and left ends of mirror part 15, thereby rotating mirror part 15 about the S1 axis using the center of mirror part 15 as a fixed point.

In this embodiment, stepped structure portions 24 and 27 contributing to the increase in the thickness compared to straight portions 16 and 25 are provided respectively on folded portions 17 and 26 in the meandering shape of second oscillation parts 14a and 14b and first oscillation parts 12a and 12b. Therefore, stress occurring inside folded portions 17 and 26 can be distributed. As a result, the pivotal angle about the S1 axis of mirror part 15 further increases, compared to a configuration in which stepped structure portions 24 and 27 are not provided. In second oscillation parts 14a and 14b according to this embodiment, thickness h1 is set to 100 μm, thickness h2 is set to 50 μm, and width W1 is set to 170 μm. Therefore, as the measurement result, the pivotal angle about the S1 axis can be increased by about 20%, compared to the conventional configuration. Likewise, in first oscillation parts 12a and 12b, thickness h3 is set to 100 μm, thickness h4 is set to 50 μm, and width W2 is set to 170 μm. Therefore, as the measurement result, the pivotal angle about the S2 axis can be increased by about 20%, compared to the conventional configuration.

In this embodiment, the case in which stepped structure portions 24 and 27 are provided in the oscillation parts including second oscillation parts 14a and 14b and first oscillation parts 12a and 12b has been described. However, stepped structure portion 24 may be provided only in second oscillation parts 14a and 14b. Thus, since the configuration of the oscillation parts can be simplified, the productivity of the optical reflection element can be improved.

The optical reflection element according to the present invention is effective in an image projecting apparatus such as a projector, a head-up display, or a head-mounted display.

What is claimed is:

1. An optical reflecting device comprising:
   a fixed frame;
   a pair of first oscillation parts of which one-side ends are connected to an inside of the fixed frame;
   a pivotable movable frame connected to and held by the other-side ends of the pair of first oscillation parts;
   a pair of second oscillation parts of which one-side ends are connected to an inside of the movable frame and which are disposed to be substantially perpendicular to the pair of first oscillation parts; and
   a pivotable mirror part connected to and held by the other-side ends of the pair of second oscillation parts,
   wherein the second oscillation parts have a meandering shape in which a plurality of straight portions and a plurality of folded portions are formed, and
   a stepped structure portion greater than the straight portions in thickness is provided in part of the folded portions.

2. The optical reflecting device according to claim 1, wherein the first oscillation parts have a meandering shape in which a plurality of straight portions and a plurality of folded portions are formed, and
   a stepped structure portion is provided in part of the folded portions of the first oscillation parts.

3. The optical reflecting device according to claim 2, wherein on the assumption that h1 is a thickness of the straight portion, h2 is a thickness of the stepped structure portion, and W1 is a width of the straight portion, $h1+h2<W1$ is satisfied.

4. The optical reflecting device according to claim 3, wherein the stepped structure portion includes a central point (bisector point) of the folded portion.

5. The optical reflecting device according to claim 4, wherein at least part of the stepped structure portion is made of a material different from that of the straight portion.

6. The optical reflecting device according to claim 5, wherein the stepped structure portion is formed by evaporation, sputtering, or dipping.

7. The optical reflecting device according to claim 2, wherein the stepped structure portion includes a central point (bisector point) of the folded portion.

8. The optical reflecting device according to claim 7, wherein at least part of the stepped structure portion is made of a material different from that of the straight portion.

9. The optical reflecting device according to claim 8, wherein the stepped structure portion is formed by evaporation, sputtering, or dipping.

10. The optical reflecting device according to claim 1, wherein on the assumption that h1 is a thickness of the straight portion, h2 is a thickness of the stepped structure portion, and W1 is a width of the straight portion, $h1+h2<W1$ is satisfied.

11. The optical reflecting device according to claim 10, wherein the stepped structure portion includes a central point (bisector point) of the folded portion.

12. The optical reflecting device according to claim 11, wherein at least part of the stepped structure portion is made of a material different from that of the straight portion.

13. The optical reflecting device according to claim 12, wherein the stepped structure portion is formed by evaporation, sputtering, or dipping.

14. The optical reflecting device according to claim 1, wherein the stepped structure portion includes a central point (bisector point) of the folded portion.

15. The optical reflecting device according to claim 14, wherein at least part of the stepped structure portion is made of a material different from that of the straight portion.

16. The optical reflecting device according to claim 15, wherein the stepped structure portion is formed by evaporation, sputtering, or dipping.

* * * * *